(12) United States Patent
Tokunaga et al.

(10) Patent No.: US 7,982,278 B2
(45) Date of Patent: Jul. 19, 2011

(54) THERMOELECTRIC MODULE

(75) Inventors: Kouji Tokunaga, Kokubu (JP); Kenichi Tajima, Kokubu (JP)

(73) Assignee: Kyocera Corporation, Kyoto (JP)

( * ) Notice: Subject to any disclaimer, the term of this patent is extended or adjusted under 35 U.S.C. 154(b) by 178 days.

(21) Appl. No.: 12/360,293

(22) Filed: Jan. 27, 2009

(65) Prior Publication Data

US 2009/0189239 A1  Jul. 30, 2009

(30) Foreign Application Priority Data

Jan. 29, 2008 (JP) ................................ 2008-018208
Dec. 24, 2008 (JP) ................................ 2008-326974

(51) Int. Cl.
  *H01L 31/058* (2006.01)
  *H01L 29/06* (2006.01)
  *H01L 35/28* (2006.01)

(52) U.S. Cl. ........ 257/467; 257/470; 257/625; 257/930; 257/E27.008; 257/E29.166; 136/203; 136/204

(58) Field of Classification Search .................. 257/467, 257/470, 625, 930, E29.166, E27.008; 136/203–204
See application file for complete search history.

(56) References Cited

U.S. PATENT DOCUMENTS

| | | | |
|---|---|---|---|
| 4,855,810 A * | 8/1989 | Gelb et al. ................. | 136/203 |
| 5,362,983 A * | 11/1994 | Yamamura et al. ........... | 257/414 |
| 5,705,434 A * | 1/1998 | Imanishi et al. ............. | 438/55 |
| 5,886,291 A * | 3/1999 | Imanishi et al. ............. | 136/203 |
| 5,950,067 A * | 9/1999 | Maegawa et al. ............ | 438/22 |
| 5,982,013 A * | 11/1999 | Kishi et al. ................. | 257/467 |
| 6,391,676 B1 * | 5/2002 | Tsuzaki et al. .............. | 438/54 |
| 2003/0041893 A1 * | 3/2003 | Shimakawa et al. .......... | 136/244 |
| 2009/0211619 A1 * | 8/2009 | Sharp et al. ................. | 136/240 |
| 2010/0119770 A1 * | 5/2010 | Hiroyama et al. ........... | 428/131 |

FOREIGN PATENT DOCUMENTS

| JP | 2000-286460 | 10/2000 |
|---|---|---|
| JP | 2000286460 A * | 10/2000 |

* cited by examiner

*Primary Examiner* — Zandra Smith
*Assistant Examiner* — Jeremy J Joy
(74) *Attorney, Agent, or Firm* — Procopio, Cory, Hargreaves & Savitch LLP

(57) ABSTRACT

A thermoelectric module has a first substrate, a second substrate spaced from the first substrate, a plurality of P type thermoelectric elements and N type thermoelectric elements arranged in the space between the first and second substrates, and a plurality of electrodes which connect the P type and N type thermoelectric elements in series. Each electrode is connected to a respective one of the plurality of P type thermoelectric elements at a first connection and a respective one of the plurality of N type thermoelectric elements in the space, and a sealant is located at an edge portion of the space. Each one of a series of first or outer electrodes closest to the edge portion of the space has a concave portion that is concaved in a direction departing from the edge portion of the space and is at a position between the first connection and the second connection.

6 Claims, 9 Drawing Sheets

THERMOELECTRIC MODULE

RELATED APPLICATIONS

The present application claims priority under 35 U.S.C. §119 to Japanese Patent Application No. 2008-018208, filed Jan. 29, 2008 and to Japanese Patent Application No. 2008-326974, filed on Dec. 24, 2008, and the contents of each of these applications are incorporated herein by reference in their entirety.

BACKGROUND

1. Field of the Invention

The present invention relates to a thermoelectric module. More specifically, the present invention relates to a thermoelectric module to be used for temperature adjustment and the like of air conditioners, refrigerators, semiconductor manufacturing apparatuses, photo-detective apparatuses, laser diodes, and the like.

2. Related Art

Conventional thermoelectric modules are known, for example, those disclosed in Japanese Laid-Open Patent Application No. 2000-286460. For the purpose of preventing deterioration by moisture, a thermoelectric module in which the outer surface of an element is coated with a sealant and a thermoelectric module in which an outer periphery of an element installation portion between substrates is filled with a sealant are disclosed.

In recent years, a thermoelectric module with improved moisture resistance has been in demand.

BRIEF SUMMARY OF THE INVENTION

In one embodiment, a thermoelectric module includes a first substrate, a second substrate spaced from the first substrate by a certain distance to define a space, a plurality of P type thermoelectric elements arranged in the space between the first substrate and the second substrate, a plurality of N type thermoelectric elements arranged in the space, a plurality of electrodes, each of which is connected to one of the plurality of P type thermoelectric elements in the space at a first connection and one of the plurality of N type thermoelectric elements in the space at a second connection so as to electrically connect in series the plurality of P type thermoelectric elements and the plurality of N type thermoelectric elements, and a sealant at an edge portion of the space. The plurality of electrodes include at least one first electrode closest to the edge portion of the space, and the first electrode has a concave portion that is concaved in a direction away from the edge portion of the space and is at a position between the first and second connections of the first electrode.

BRIEF DESCRIPTION OF THE DRAWINGS

The present disclosure, in accordance with one or more embodiments, is described in detail with reference to the following figures. The drawings are provided for purposes of illustration only and merely depict typical or exemplary embodiments of the disclosure. These drawings are provided to facilitate the reader's understanding of the disclosure and shall not be considered limiting of the breadth, scope, or applicability of the disclosure. It should be noted that for clarity and ease of illustration these drawings are not necessarily made to scale.

DETAILED DESCRIPTION

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present invention.

A thermoelectric module according to a first embodiment is shown in FIGS. 1 to 5.

Figure 1:
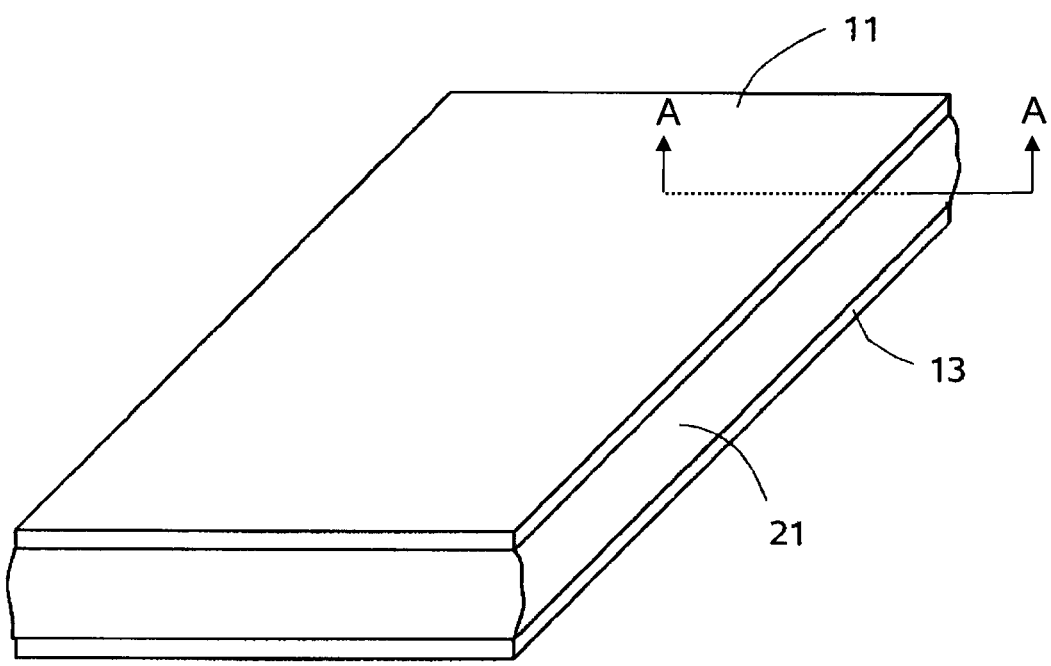
FIG. 1 is a perspective view illustrating a thermoelectric module according to a first embodiment.
Figure 2:
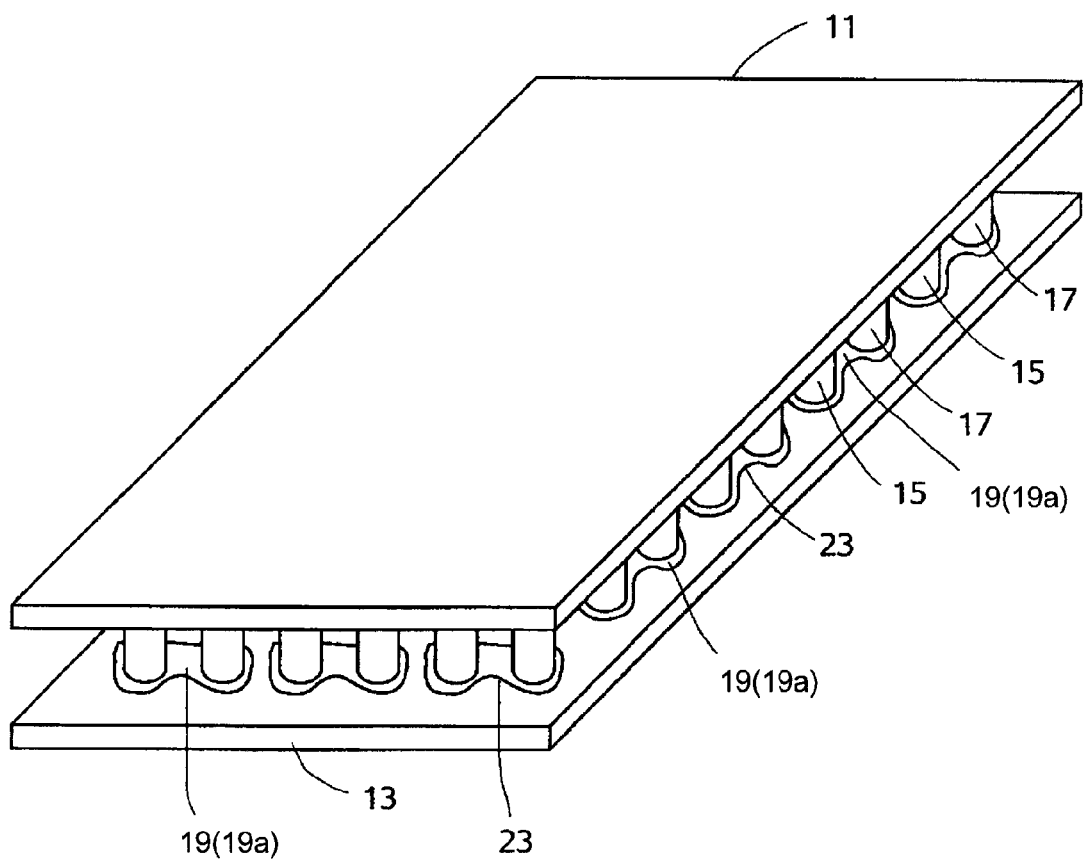
FIG. 2 is a perspective view of the thermoelectric module shown in FIG. 1 with the sealing member removed.
Figure 4:
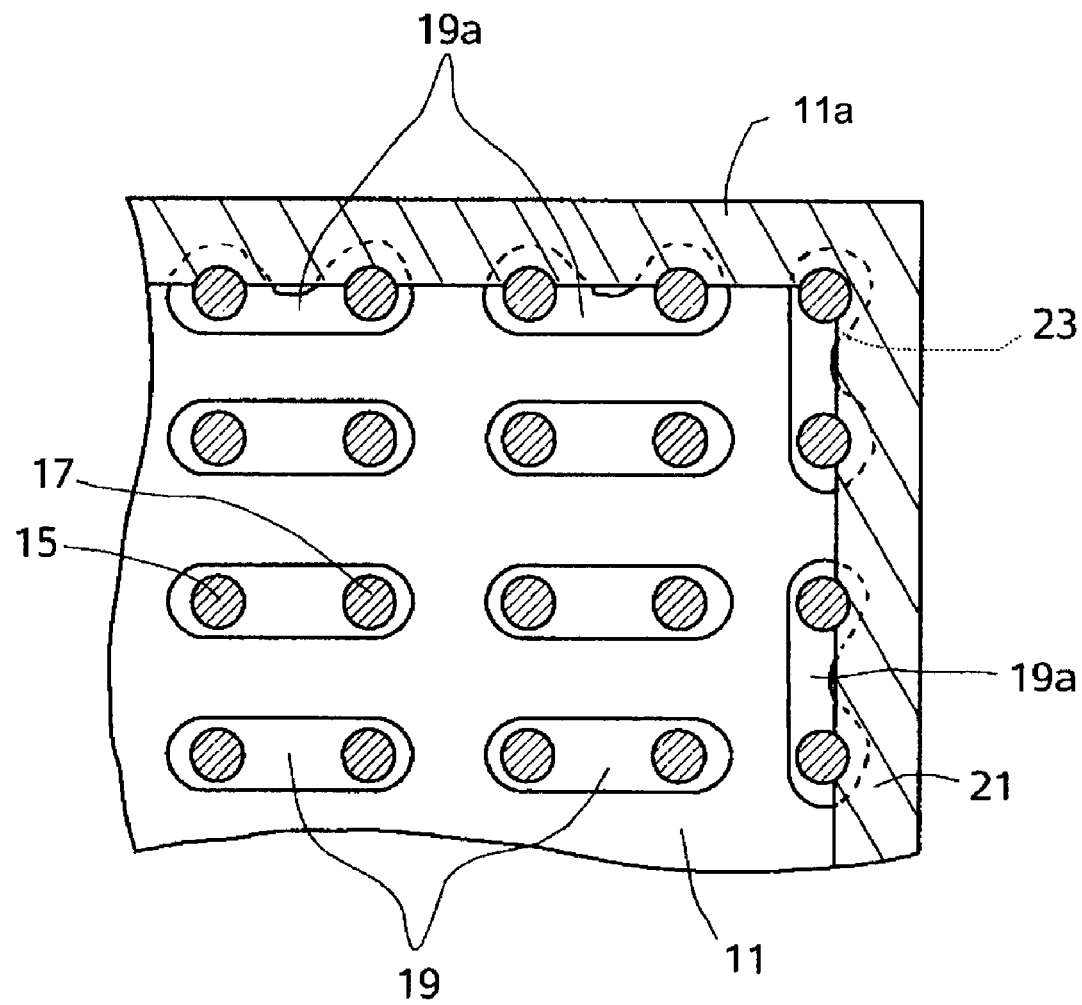
FIG. 4 is a horizontal sectional view taken along the line A-A of FIG. 1.

As shown in FIGS. 1 and 2, the thermoelectric module of the first embodiment is provided with a pair of substrates 11 and 13 which are spaced apart to define a space between the substrates. A plurality of P type thermoelectric elements 15 and a plurality of N type thermoelectric elements 17 are arranged in the space between opposed surfaces of the pair of substrates 11 and 13, and a plurality of electrodes 19 are arranged on the opposed surfaces of the pair of substrates 11 and 13 for electrically connecting in series the P type thermoelectric elements 15 and the N type thermoelectric elements 17. In this thermoelectric module, a sealant 21 is disposed on an edge portion of a space between the pair of substrates 11 and 13, as illustrated in FIGS. 1 and 4. In this manner, the space existing between the pair of substrates 11 and 13 is in a tightly sealed state being surrounded by the sealant 21, thereby improving moisture resistance of the thermoelectric module.

Figure 3:
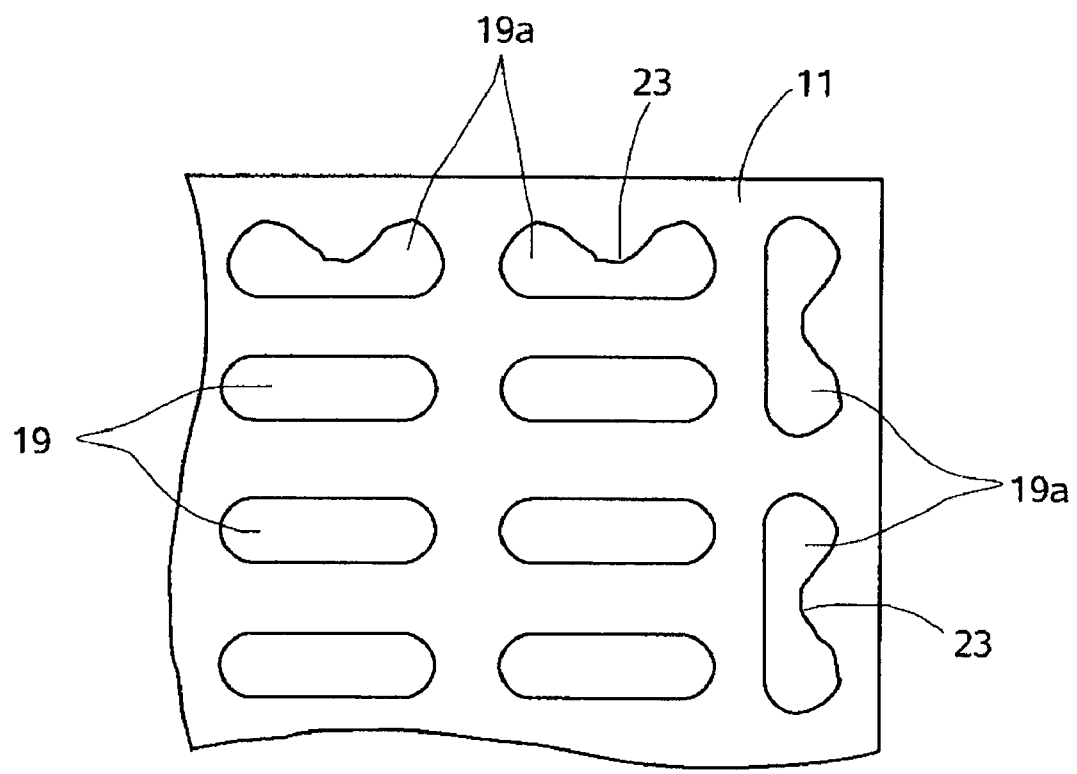
FIG. 3 is a plan view of a corner portion of one of the substrates in the thermoelectric module of FIG. 1, showing an arrangement of electrodes in the thermoelectric module.

As shown in FIGS. 3 and 4, each electrode on each of the substrates is connected to an end of a respective N-type thermoelectric element at a first connection and to an end of a respective adjacent P-type thermoelectric element at a second connection. As illustrated in FIGS. 2 to 4, the electrodes include a plurality of first electrodes 19a disposed along the edge portion of the substrate 11, with first electrodes 19a disposed in a similar manner along the corresponding edge portion of substrate 13. Each first electrode has an outer rim close to an edge 11a of the substrate. The outer rim includes a concave portion 23 that is concaved inwardly in a direction away from the outer edge of the substrate. This concave portion 23 is positioned between opposite ends of the electrode, i.e. between the part of the electrode which is connected to the P type thermoelectric element 15 at a first connection and the part of the electrode which is connected to the N type thermoelectric element 17 at a second connection, and is spaced inward from the edge portion of the substrate 11, as illustrated in FIGS. 2 and 3. Since the concave portion 23 is located at a part of the first electrode 19a as described above, it is possible to reduce the risk of the first or outer electrodes 19a being exposed to the outside of the sealant 21, thereby making it possible to suppress or reduce deterioration of the first electrode 19a. As a result, the moisture resistance of the thermoelectric module is further improved, and the insulating property is also improved.

The part of the outer rim of the electrode forming the concave portion 23 provided on the first electrode 19a may have a curved line shape. When the thermoelectric module is used, one of the substrates 11 and 13 has a high temperature and the other one has a low temperature. Due to such temperature change, the substrate 11 is deformed so that a stress that can cause peeling-off from the substrate 11 is imparted to the first electrode 19a. This stress is alleviated by the concave portion 23 of the outer rim, which is formed as a curved line in one embodiment, so that durability of the first electrodes 19a is improved, resulting in improvement of durability of the thermoelectric module.

In this case, the curved part of the outer rim forming the concave portion 23 of the first or outer electrodes 19a may in the form of a circular arc since such a shape facilitates the stress alleviation. In other embodiments, the concave portion may be curved in the form of an elliptic arc and the like.

Figure 9:
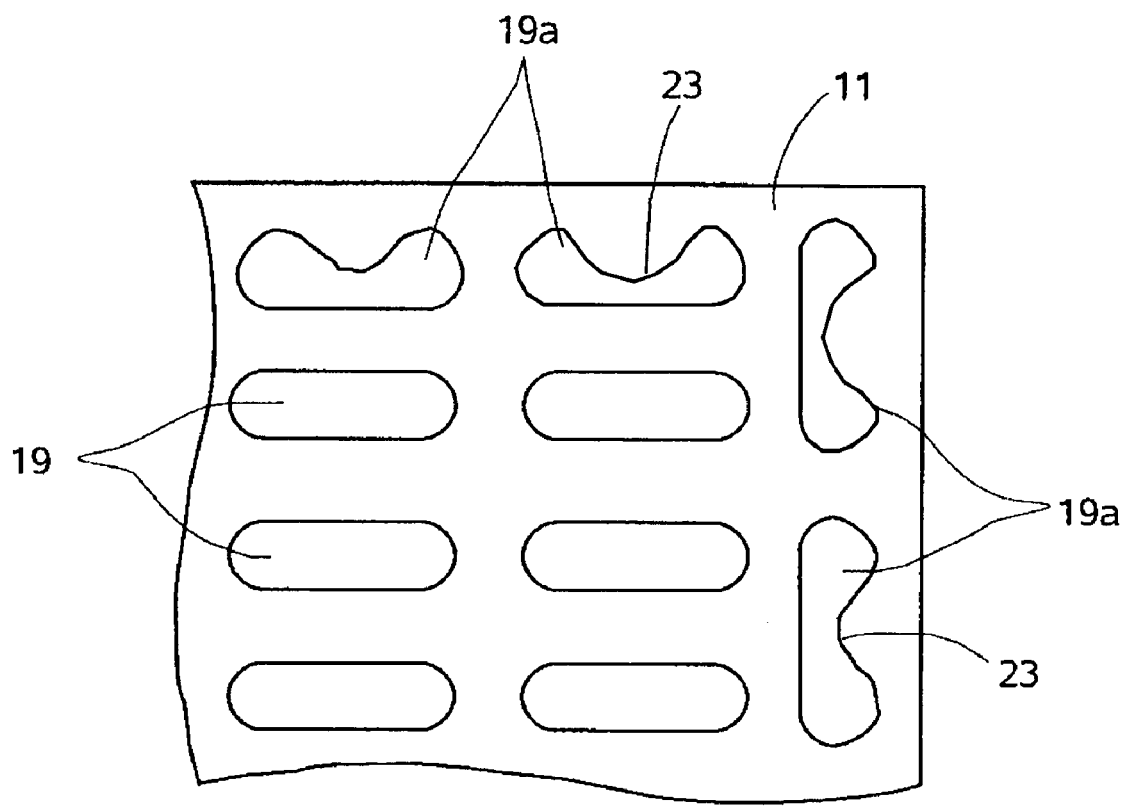
FIG. 9 is a plan view of a corner portion of one of the substrates showing an arrangement of electrodes in a thermoelectric module according to a fifth embodiment.

As shown in FIG. 9, the size or a depth of the concave portion 23 of the first electrodes 19a in the angular or corner portions of the substrate 11 may be larger or deeper than that of the concave portion 23 of the first electrodes 19a at other portions of the substrate 11, since the stress tends to be increased at angular or corner portions of the substrate 11. In this case, it is possible to alleviate the larger stress caused at the angular portion of the substrate 11.

In alternative embodiments, the curved line part forming the concave portion 23 of the first electrode 19a may be increased in number so that a plurality of the curved line parts can be formed on one of the first electrodes 19a. In this case, the concave portion 23 is in the form of a wave or the like.

Further, the outer rim of the first electrodes 19a may be formed of a curved line in the form of a circular arc or the like at opposite ends of the electrode. In this case, it is possible to alleviate the stress also at the opposite ends of the first electrode 19a.

Also, as shown in FIGS. 3 and 4, the sealing member 21 may be overlapped with the concave portion 23. With such an arrangement, the contact area between the sealing member 21 and the substrate 11 is increased, thereby further improving the sealing property.

Figure 5:
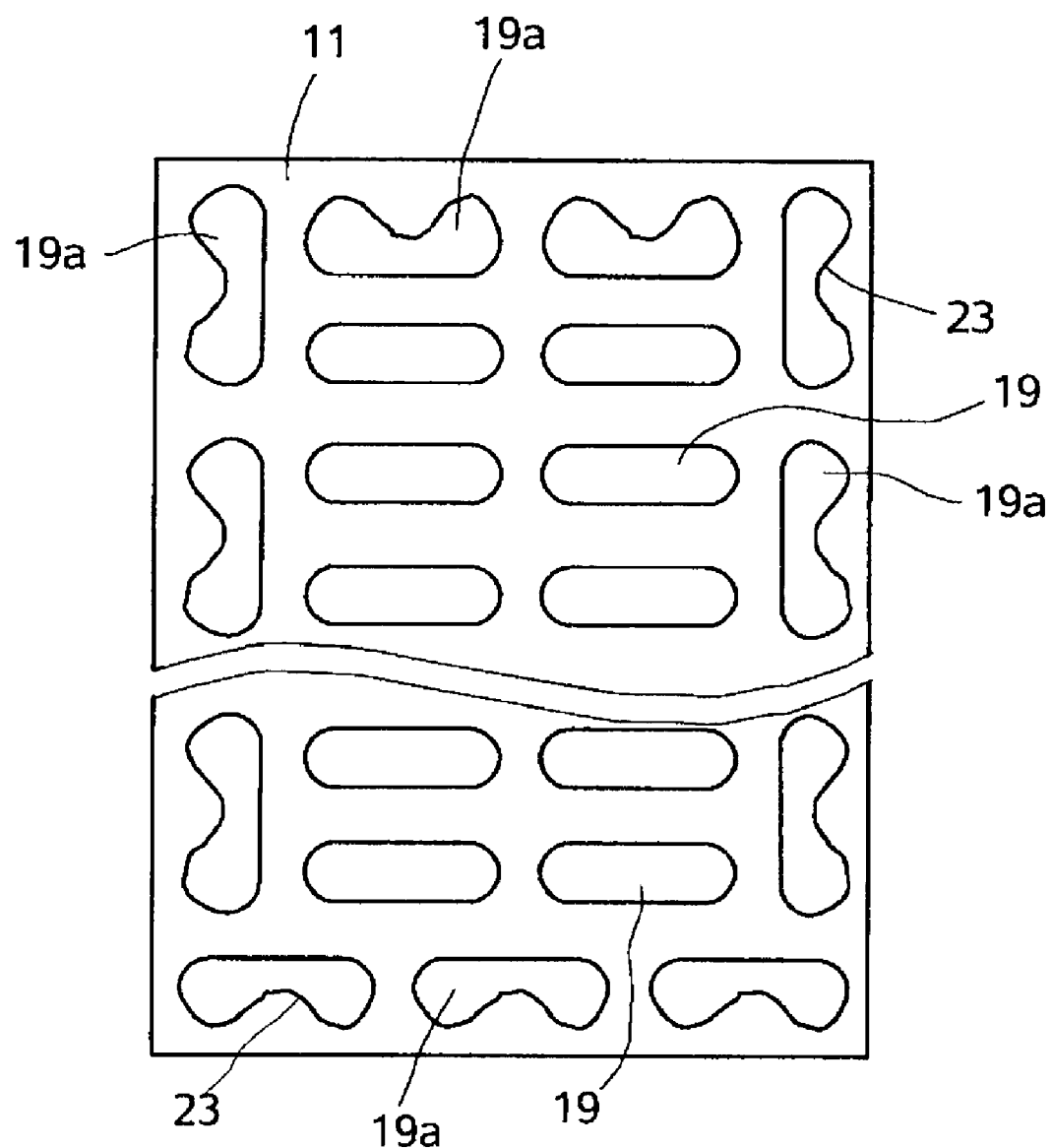
FIG. 5 is a plan view of one of the substrates showing an arrangement of electrodes in the thermoelectric module shown in FIG. 1.

As shown in FIG. 5, in the case where the opposed surface of the substrate 11 is square or rectangular, longitudinal directions of the first electrodes 19a disposed along the edge portions of the substrate 11 may be oriented along or parallel with the respective side edge of the opposed surface. With such an arrangement, the first electrodes 19a are shielded from exposure to the outside by the sealing member 21 extending along the edge, thereby making it possible to further improve the moisture resistance and insulating property of the thermoelectric module. Also, as compared to the case in which all of the longitudinal directions of the electrodes 19 are disposed in one direction, i.e. all electrodes are arranged parallel to one another, it is possible to reduce a difference in strength which may be caused by a position of curvature of the substrate, thereby improving strength of the substrate.

Though each of the first electrodes 19a disposed along the edge portion of the substrate 11 has a concave portion 23 that is formed only at the outer rim or portion closest to the edge of the substrate 11 with the opposite or inner rim of each first electrode 19a being in the form of a straight line in the first embodiment shown in FIGS. 3 to 5, the first or outer electrodes in alternative embodiments may have different shapes, as described below in connection with FIGS. 6 to 8.

Figure 6:
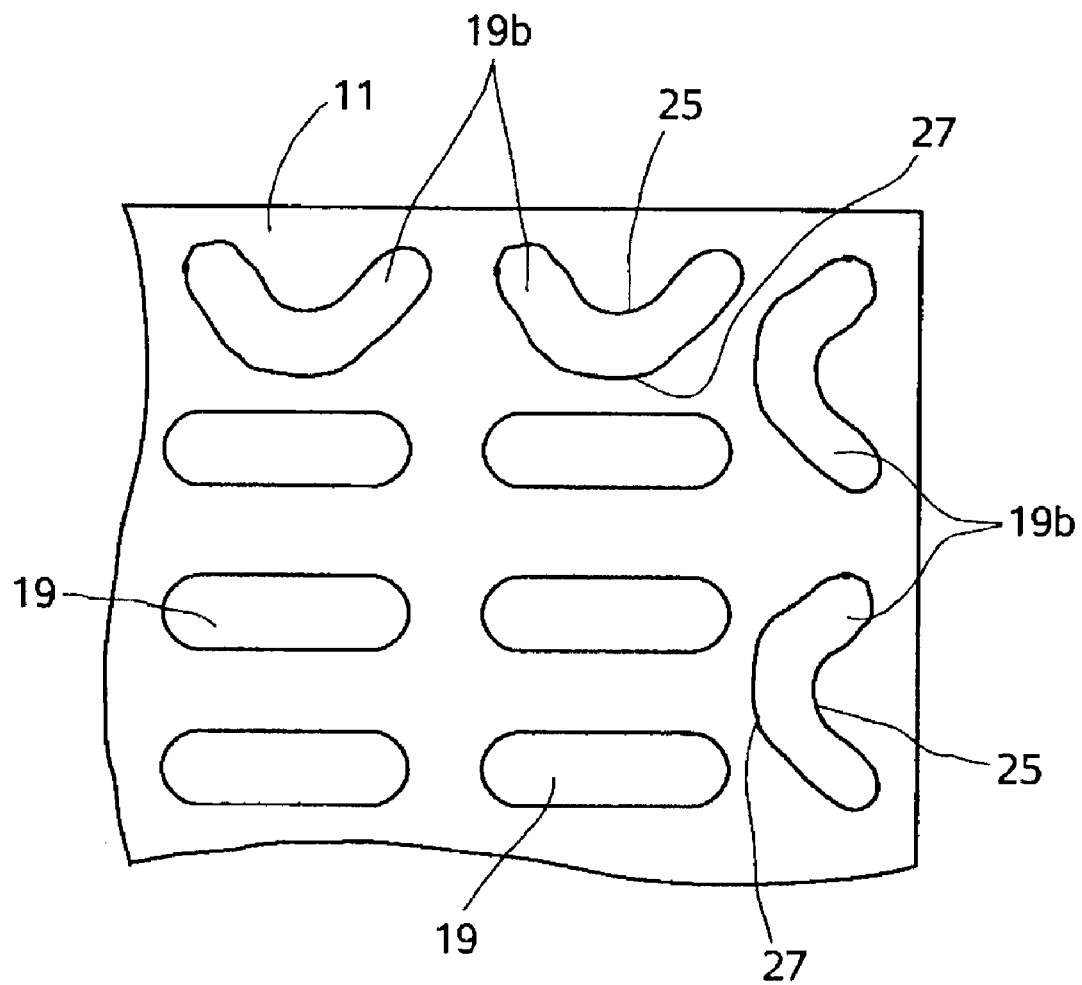
FIG. 6 is a plan view of a corner portion of one of the substrates showing an arrangement of electrodes in a thermoelectric module according to a second embodiment.

A thermoelectric module according to a second embodiment is shown in FIG. 6. Some features of this module are identical to those of the previous embodiment and are not described in connection with FIG. 6, and like reference numbers are used for these like features as appropriate.

In the thermoelectric module of FIG. 6, each of the first or outer electrodes 19b disposed along the edge portion of the substrate 11 has a concave portion 25 on its outer rim closest to the edge of the substrate and a convex portion 27 on its inner rim which faces away from the edge of the substrate. The concave portion is concaved in a direction away from the edge portion of the substrate 11. The convex portion 27 is positioned between the connecting part or first connection to a respective P type thermoelectric element 15 and the connecting part or second connection to a respective N type thermoelectric element 17. With such an arrangement, the reduction in area of the first electrode 19b as a result of the concave portion 25 is limited or eliminated, reducing or avoiding reduction in rigidity as a result of the concave portion, as compared to the first embodiment shown in FIGS. 3 and 4. With this arrangement, a higher level of rigidity of the thermoelectric module as a whole is maintained.

In this embodiment, the convex portion 27 in the first electrode 19b may be formed of a curved line in the form of a circular arc since such a part facilitates stress alleviation. As other examples of the form, a curved line in the form of an elliptic arc and the like may be used.

Since the stress tends to be increased at an angular or corner portions of the substrate 11, a size or a projection length of the curved line part forming the convex portion 27 of the first electrode 19b in the angular portion of the substrate 11 may be larger or longer than the curved part forming the convex portion 27 of the first electrode 19b at other portions of the substrate 11. In this case, it is possible to alleviate the larger stress caused at the angular or corner portions of the substrate 11.

Also, the curved line part forming the convex portion 27 of the first electrode 19b may be increased in number so that a plurality of curved line parts are formed on one or more of the first electrodes 19b.

Further, the outer rim of the first electrode 19b may be formed of a curved line in the form of a circular arc or the like at opposite ends. In this case, it is possible to alleviate the stress also at the opposite ends of the first electrode 19b.

Figure 7:
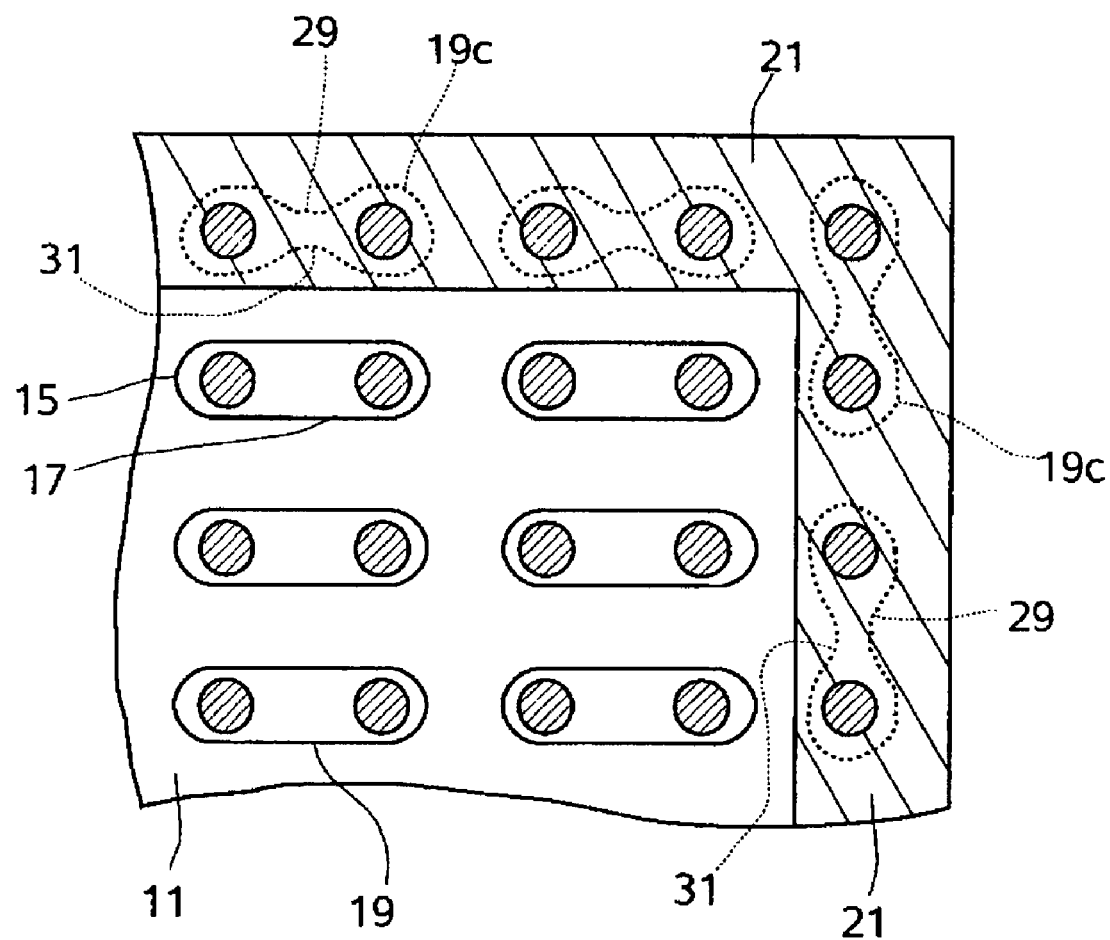
FIG. 7 is a horizontal sectional view of a corner portion of one of the substrates showing an arrangement of electrodes in a thermoelectric module according to a third embodiment.

A thermoelectric module according to a third embodiment is shown in FIG. 7. In the present embodiment, only the features that are different from the first embodiment are described, and like reference numerals are used for like features as appropriate. Descriptions using the same reference numerals to indicate the same constituent features are not repeated here.

In the thermoelectric module according to the present embodiment, each of first electrodes 19c disposed along the edge portion of the substrate 11 has concave portions 29 and 31 on both its outer and inner rims between the connecting part or first connection to the respective P type thermoelectric element 15 and the connecting part or second connection to the N type thermoelectric element 17. With such an arrangement, the first electrodes 19c are shielded from exposure to the outside by the sealant 21, thereby suppressing or reducing deterioration of the first electrode 19c. Also, in the case where the sealant 21 is disposed in such a manner as to cover the whole outer rims of the first electrodes 19c disposed along the edge portion of the substrate 11, as shown in FIG. 7, contact area between the sealant 21 and the substrate 11 is increased due to the concave portions 29 and 31, thereby further improving the sealing property.

In this case, the concave portions 29 and 31 provided in the first electrode 19c which are opposed to each other may each be formed of a curved line in the form of a circular arc since such a portion facilitates stress alleviation. As other examples of the form, a curved line in the form of an elliptic arc and the like may be used.

Since the stress tends to be increased at an angular or corner portions of the substrate 11, the size or a depth of the curved line of the concave portions 29 and 31 of the first electrodes 19c in the angular portions of the substrate 11 may be larger or deeper than the curved part forming the concave portions 29 and 31 of the first electrode 19c at other portions of the substrate 11. In this case, it is possible to alleviate the larger stress caused at the angular or corner portions of the substrate 11.

Also, a pair of the concave portions 29 and 31 of the first electrode 19c may be increased in number so that a plurality of pairs of concave portions are formed on one or more of the first electrodes 19c.

Further, the outer rim of the first electrode 19c may be formed of a curved line in the form of a circular arc or the like at opposite ends. In this case, it is possible to alleviate the stress also at the opposite ends of the first electrode 19c.

Figure 8:
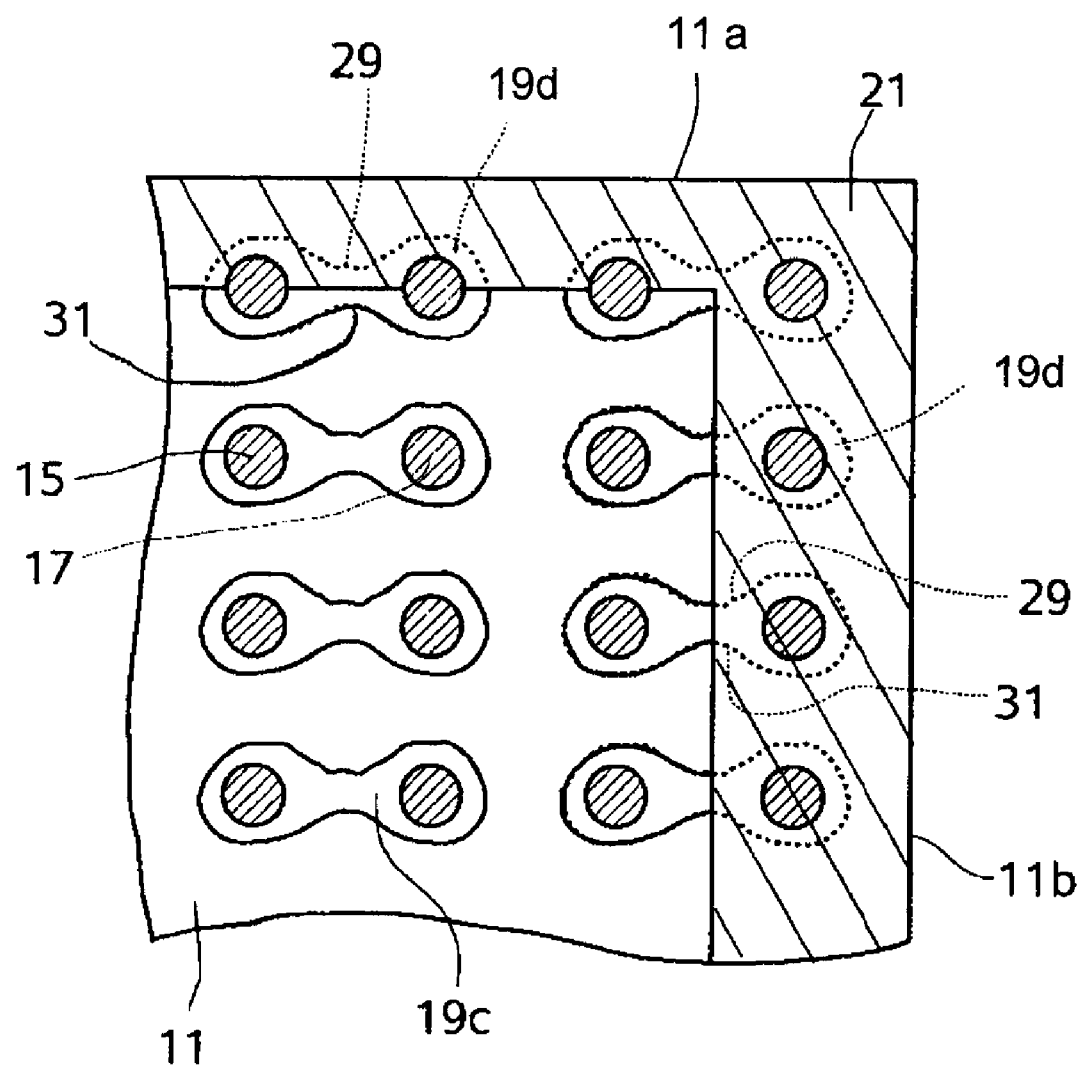
FIG. 8 is a horizontal sectional view of a corner portion of one of the substrates showing an arrangement of electrodes in a thermoelectric module according to a fourth embodiment.

A thermoelectric module according to a fourth embodiment is shown in FIG. 8. In this embodiment, only the features that are different from the first embodiment are described. Descriptions using the same reference numerals to indicate the same constituent features are not repeated here.

In the thermoelectric module according to the present embodiment, each of the first electrodes 19d disposed along the edge portions of the substrate 11 has two opposing concave portions 29 and 31 between the connecting part or first connection to the respective P type thermoelectric element 15 and the connecting part or second connection to the respective N type thermoelectric element 17, as in the previous embodiment. However, unlike the previous embodiment, all the electrodes extend in the same direction, parallel to one another and to edge 11a, so that some of the outermost electrodes 19d are parallel to the adjacent edges 11a while others extend transverse to adjacent edge 11b, as seen in FIG. 8. The inner electrodes 19c may also have opposing concave portions between the first and second connections, as illustrated in FIG. 8, or may have straight edges as in the previous embodiments. In this embodiment, the outermost electrodes 19d adjacent the edges 11b which extend transverse to edges 11a have their outer ends closest to the respective edge 11b. With such an arrangement, an anchoring effect is achieved since the sealant 21 is overlapped with the concave portions 29 and 31 in the first electrodes 19d which are adjacent the edges 11b and extend transverse to the edges 11b of the substrate 11. With such an arrangement, contact strength between the sealant 21 and the substrate 11 is improved, thereby further improving the moisture resistance.

The sealing member 21 may be fill the entire space between the pair of substrates 11 and 13 in some embodiments, but the sealant 21 is disposed only at the edge portion of the substrates 11 and 13 in the illustrated embodiments, for the following reasons. In the illustrated embodiments, both the filled parts in which the sealant 21 is disposed and a clearance part are disposed between the pair of substrates 11 and 13, with the clearance part or spacing reducing heat transmission between the substrate on the heating side of the thermoelectric module and the substrate on the cooling side. This in turn reduces the influence of the sealant on a cold heat property of the thermoelectric module. When the whole space between the pair of substrates 11 and 13 is filled with the sealant 21, the cold heat property is deteriorated though it is possible to improve the moisture resistance and the like of the thermoelectric module. Since one of the substrates 11 and 13 serves as a heating side when the other one serves as an endothermic (cooling) side in the thermoelectric module, the cold heat property is deteriorated when the whole space between each of the plurality of thermoelectric elements is filled with a resin material due to transmission of heat between the substrates 11 and 13 through the resin material. In contrast, in the case where the sealant 21 is disposed only at the edge portion of the substrate 11, transmission of heat between the substrates 11 and 13 is reduced.

Examples of the sealant 21 include a silicone resin, an epoxy resin, and the like, but are not particularly limited thereto. A ceramic substrate such as alumina may be used as the substrates 11 and 13, but it is possible to enhance contact strength of the electrodes by using a substrate such as an epoxy resin substrate and a polyimide resin substrate since such substrate is easily deformed.

The shapes and arrangements of the first electrodes 19a to 19d in the substrate 11 have been described in the foregoing embodiments, and the first electrodes 19a to 19d may be disposed in the other substrate 13 in the same manner as in the substrate 11. Also, though the example of the case wherein the thermoelectric elements are of circular cross-section is described in the foregoing embodiments, the sectional shape of the thermoelectric element may be of other shapes in alternative embodiments, such as a polygonal shape. In the case where the part of the outer rim of the outermost electrodes is a concave portion formed of a curved line as in the foregoing embodiments, the circular sectional shape facilitates positioning along the concave portion. With such an arrangement, it is possible to reduce the risk of the thermoelectric element being easily exposed from the electrode.

It is possible to mount each of the thermoelectric modules according to the foregoing embodiments on a power generation apparatus as a power generation means or on a temperature adjustment apparatus as a temperature adjustment means. Examples of the temperature adjustment apparatus include a cooling apparatus wherein the thermoelectric module is used as a cooling means, a heating apparatus wherein the thermoelectric module is used as a heating means, and the like.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

The invention claimed is:

1. A thermoelectric module comprising:
a first substrate;
a second substrate spaced from the first substrate to define a space between the first and second substrates;
a plurality of P type thermoelectric elements arranged in the space;
a plurality of N type thermoelectric elements arranged in the space;
a plurality of electrodes, each electrode being connected to one of the plurality of P type thermoelectric elements at a first connection and one of the plurality of N type thermoelectric elements at a second connection so as to electrically connect in series the plurality of P type thermoelectric elements and the plurality of N type thermoelectric elements; and
a sealant at an edge portion of the space,
wherein the plurality of electrodes includes at least one first electrode closest to the edge portion of the space, and
the first electrode has a concave portion that is concaved in a direction away from the edge portion of the space and is at a position between the first connection and the second connection of the first electrode,
wherein the first electrode has an outer rim closest to the edge portion of the space and an inner rim opposite to the outer rim, the concave portion being located on the outer rim, and the inner rim having a convex portion that is projected in a direction departing from the edge portion of the space and is at a position between the first and second connections of the first electrode.

2. A thermoelectric module comprising:
a first substrate:
a second substrate spaced from the first substrate to define a space between the first and second substrates;
a plurality of P type thermoelectric elements arranged in the space;
a plurality of N type thermoelectric elements arranged in the space;
a plurality of electrodes, each electrode being connected to one of the plurality of P type thermoelectric elements at a first connection and one of the plurality of N type thermoelectric elements at a second connection so as to electrically connect in series the plurality of P type thermoelectric elements and the plurality of N type thermoelectric elements; and
a sealant at an edge portion of the space,
wherein the plurality of electrodes includes at least one first electrode closest to the edge portion of the space, and
the first electrode has a concave portion that is concaved in a direction away from the edge portion of the space and is at a position between the first connection and the second connection of the first electrode,
wherein an outer rim closest to the edge portion of the space in the first electrode is a curved line.

3. A thermoelectric module comprising:
a first substrate;
a second substrate spaced from the first substrate to define a space between the first and second substrates;
a plurality of P type thermoelectric elements arranged in the space;
a plurality of N type thermoelectric elements arranged in the space;
a plurality of electrodes, each electrode being connected to one of the plurality of P type thermoelectric elements at a first connection and one of the plurality of N type thermoelectric elements at a second connection so as to electrically connect in series the plurality of P type thermoelectric elements and the plurality of N type thermoelectric elements; and
a sealant at an edge portion of the space,
wherein the plurality of electrodes includes at least one first electrode closest to the edge portion of the space, and
the first electrode has a concave portion that is concaved in a direction away from the edge portion of the space and is at a position between the first connection and the second connection of the first electrode,
wherein the at least one first electrode comprises a plurality of spaced first electrodes which are spaced apart from each other, each first electrode having an outer rim facing the edge portion, the outer rim having a concave portion located between the first and second connections of the first electrode to the respective P type and N type thermoelectric elements.

4. The thermoelectric module according to claim 3, wherein each first electrode has an inner rim opposite to the outer rim, the inner rim being substantially straight.

5. The thermoelectric module according to claim 3, wherein each first electrode has an inner rim opposite to the outer rim, the inner rim having a concave portion located between the first and second connections.

6. The thermoelectric module according to claim 3, wherein each first electrode has an inner rim opposite to the outer rim, the inner rim having a convex portion located between the first and second connections.

* * * * *